United States Patent [19]
Johnson et al.

Patent Number: 6,047,025
Date of Patent: Apr. 4, 2000

[54] METHOD AND APPARATUS FOR EQUALLIZATION IN AN ASYMMETRIC DIGITAL AUBSCRIBER LINE COMMUNICATIONS SYSTEM

[75] Inventors: Terence L. Johnson, Austin, Tex.; Albert H. Higashi, Gilbert, Ariz.

[73] Assignee: Motorola, Inc., Schaumburg, Ill.

[21] Appl. No.: 09/023,061

[22] Filed: Feb. 13, 1998

[51] Int. Cl.[7] .............................. H03H 7/30; H03H 7/40; H03K 5/159
[52] U.S. Cl. ........................................... 375/232; 708/323
[58] Field of Search .............................. 375/232; 708/323

[56] References Cited

U.S. PATENT DOCUMENTS

| | | | |
|---|---|---|---|
| 4,021,738 | 5/1977 | Gitlin et al. | 375/232 |
| 5,311,546 | 5/1994 | Paik et al. | 375/232 |
| 5,479,447 | 12/1995 | Chow et al. | 375/260 |
| 5,732,112 | 3/1998 | Langberg | 375/349 |

OTHER PUBLICATIONS

D.E. Johnson et al., Basic Electric Circuit Analysis, Department of Electrical Engineering, Louisiana State University, pp. 507–512 (1978).

*Primary Examiner*—Don N. Vo
*Assistant Examiner*—Phuong Phu
*Attorney, Agent, or Firm*—Paul J. Polansky; Daniel D. Hill

[57] ABSTRACT

An equalizer (106, 146) for use in systems such as an asymmetric digital subscriber line (ADSL) transceiver (5) reduces the number of calculations required for updating the equalizer coefficients. The equalizer (106, 146) takes advantage of the substantially symmetrical phase and amplitude distortion of the signal constellation, which causes both the amplitude and the phase relationship of the calculated error term for each constellation point to be equal. Instead of performing a full complex multiplication, the equalizer (106, 146) uses some but not all of the product terms between the real and imaginary components of the calculated error term and the conjugate of the received data estimate in the coefficient update calculation. The result is then scaled to account for the missing terms. The resulting equalizer (106, 146) requires fewer calculations for coefficient updating.

12 Claims, 5 Drawing Sheets

METHOD AND APPARATUS FOR EQUALLIZATION IN AN ASYMMETRIC DIGITAL AUBSCRIBER LINE COMMUNICATIONS SYSTEM

FIELD OF THE INVENTION

This invention relates generally to communications, and more particularly, to equalization in an ADSL communications system.

BACKGROUND OF THE INVENTION

In order to make high data rate interactive services such as video and internet access available to more residential and small business customers, high-speed data communications paths are required. Although fiber optic cable is the preferred transmission media for such high data rate services, it is not readily available in existing communication networks and the expense of installing fiber optic cabling is prohibitive. Current telephone wiring connections, which consist of copper twisted-pair media, were not originally designed to support the data rates or bandwidth required for interactive services such as video on demand or even high speed internet connections. Asymmetric Digital Subscriber Line (ADSL) technology has been developed to increase the effective bandwidth of existing twisted-pair connections, allowing interactive services to be provided without requiring the installation of fiber optic cable.

Discrete multi-tone (DMT) is a multi-carrier technique which divides the available bandwidth of twisted-pair copper media connections into mini-subchannels or bins. The DMT technique has been adopted in the ANSI T1.413 standard (ADSL standard). In the ADSL standard, DMT is used to generate 250 separate 4.3125 kilohertz subchannels from 26 kilohertz to 1.1 megahertz for downstream transmission to an end user. Likewise, DMT is used to generate 26 subchannels from 26 kilohertz to 138 kilohertz for upstream transmission by an end user.

In the ADSL system, changing channel conditions require adaptive equalizers to improve the signal-to-noise ratio (SNR) of the received signal. A Fast Fourier Transform (FFT) module is used to convert a received time domain signal to the frequency domain. The equalization is performed in the frequency domain on individual carriers of a transmission using DMT. Each of the carriers which make up the DMT symbol contains a single quadrature amplitude modulated (QAM) signal, and is equalized using a one-tap equalizer which is updated independent from each of the other carriers.

Figure 1:
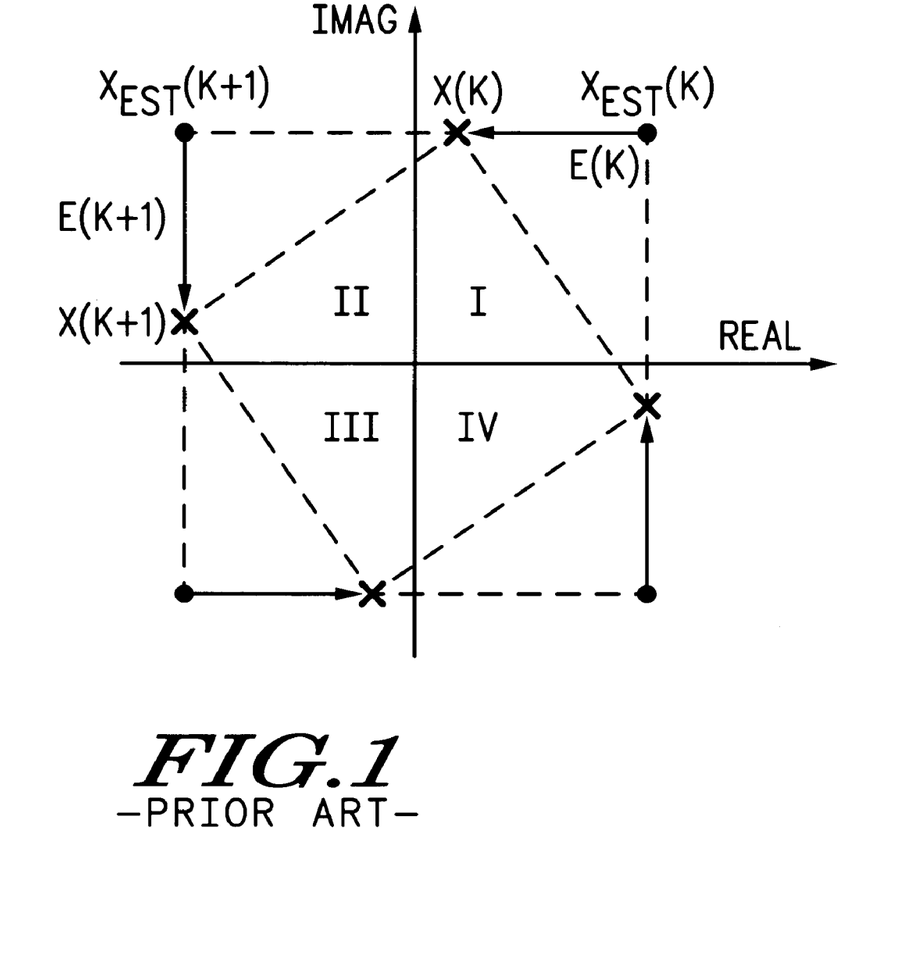
FIG. 1 illustrates, in graphical form, a signal constellation of a linear signal which is subject to phase and amplitude errors.

For example, FIG. 1 illustrates, in graphical form, a signal constellation of a frequency domain signal which is subjected to phase and amplitude errors. The horizontal axis is the real part and the vertical axis is the imaginary part. The dots, one of which is labeled "$X_{EST}(k)$", indicate the desired frequency domain signal in vector format, and the Xs, one of which is labeled "X(k)", indicate the received frequency domain signal. For purposes of simplicity and clarity, the signal constellation of FIG. 1 is illustrated with only one signal per quadrant. Other signal constellations may have more or fewer signals in each of the four quadrants. A calculated error term labeled "E(k)" is indicated as a vector between the desired frequency domain signal and the received frequency domain signal. In FIG. 1, there is no phase or amplitude imbalance, so the calculated error term has the same relative amplitude and phase relationship for each quadrant.

Equalization is performed on the signal constellation of FIG. 1 using the least mean squares (LMS) algorithm and requires complex multiplies to compute the coefficient updates. Adaptive updates are performed using the following equation:

$$W(k)=W(k-1)+2\mu E(k)X^*_{EST}(k) \qquad (1)$$

where:
W(k)=equalizer coefficient at time k;
$2\mu$=adaptation constant;
E(k)=calculated error term; and
$X^*_{EST}(k)$=conjugate of received data estimate.

In a DMT system with a large number of carriers, performing equalization using the above equation to calculate the coefficients can result in a large number of calculations. What is needed, then, is a method for performing the equalization function which reduces the number of required calculations. Such a method and an equalizer using this method are provided by the present invention, whose features and advantages will be more clearly understood from the following detailed description taken in conjunction with the accompanying drawings.

DETAILED DESCRIPTION OF THE DRAWINGS

Generally, the present invention provides an adaptive equalizer in an ADSL system that reduces the number of calculations required for updating equalizer coefficients. The equalizer reduces the number of calculations by taking advantage of the substantially symmetrical phase and amplitude distortion of the signal constellation, which causes both the amplitude and the phase relationship of the calculated error term for each constellation point to be equal. Therefore, it is only necessary to use either the real or imaginary term of either the calculated error term or the conjugate of the received data estimate in the coefficient update calculation.

Figure 2:
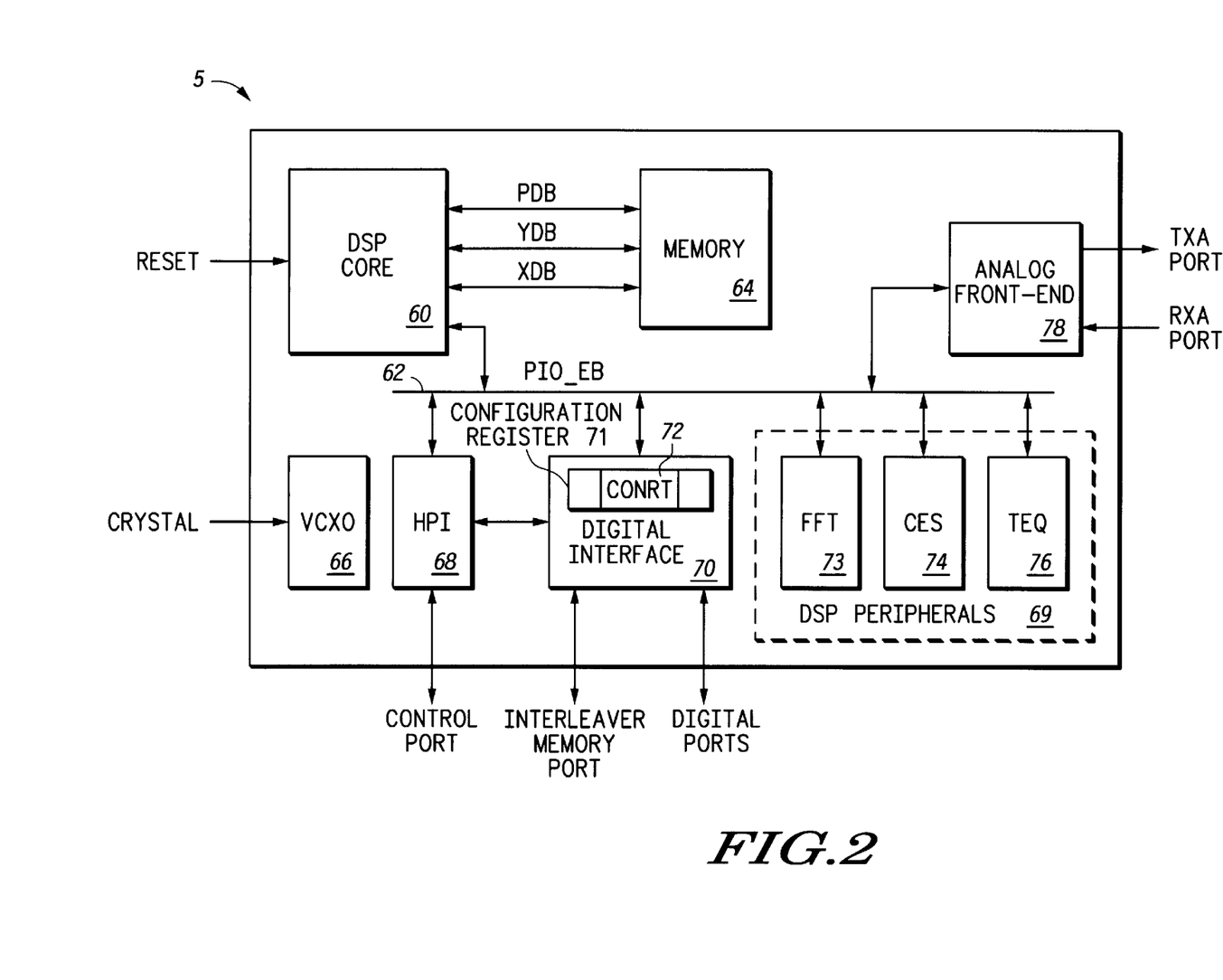
FIG. 2 illustrates, in block diagram form, an ADSL transceiver in accordance with the present invention.

FIG. 2 illustrates an ADSL transceiver 5 in accordance with the present invention. ADSL transceiver 5 is a single integrated circuit which includes a DSP core 60, a memory 64, a voltage controlled oscillator (VCXO) 66, a host processor interface (HPI) 68, a plurality of DSP peripherals 69, a digital interface 70, and an analog front-end (AFE) 78. Note the terms "analog front end" and "analog and line interface" are used interchangeably in this specification. Digital interface 70 includes a configuration register 71 storing a control bit 72 labeled "CONRT". DSP peripherals 69 are hardware peripherals including a fast Fourier transform (FFT) module 73, a circular echo synthesis (CES) module 74, and a time domain equalizer (TEQ) module 76.

In the illustrated embodiment, the transceiver architecture is designed using a digital signal processor (DSP) core. It should be noted however that other types of processor cores could also be implemented. Peripheral modules, or processing elements, of the transceiver communicate with the DSP processor and are implemented as peripheral modules to the DSP processor. The DSP processor may access each of the peripheral modules through a standard memory -read/write operation or through one of six programmable DMA channels. The DSP processor core may be implemented as a core of a DSP56301 single chip DSP, which is available from Motorola, Inc., of Austin, Tex.

DSP core 60 has an input terminal for receiving a reset signal labeled "RESET". DSP core 60 is bidirectionally coupled to memory 64 via three dedicated buses labeled "PDB", "YDB", and "XDB". DSP core 60 is also bidirectionally coupled to a peripheral bus labeled "PIO_EB" bus 62. VCXO 66 has an input terminal for connection to a crystal and receives a signal labeled "CRYSTAL" thereon. HPI 68 bidirectionally communicates with an external host processor via a port labeled "CONTROL PORT" and bidirectionally communicates with digital interface 70. Digital interface 70 bidirectionally communicates with external memory via a port labeled "INTERLEAVER MEMORY PORT" and additional ports which supply or receive labeled "DIGITAL PORTS". DSP core 60 bidirectionally communicates with HPI 68, digital interface 70, FFT module 73, CES module 74, TEQ module 76, and analog front-end 78 via PIO_EB bus 62. Analog front-end 78 provides information via a signal labeled "TXA PORT" and receives information via a signal labeled "RXA PORT".

ADSL transceiver 5 provides a flexible and configurable circuit which may be programmed to operate as either a central office (CO) or a remote terminal (RT). ADSL transceiver 5 provides hardware processing resources whose inputs and outputs may be selectively configured by a user to implement either the central office or the remote terminal in an efficient manner. Stated another way, ADSL transceiver 5 may be selectively configured as either a central office or a remote terminal and is not required to be exclusively one or the other. This selectivity allows a single integrated circuit to be designed and manufactured for both CO and RT equipment.

In FIG. 2, DSP core 60 accesses each of a plurality of transceiver peripheral modules via PIO_EB bus 62. The plurality of peripheral modules include host processor interface (HPI) 68, digital interface 70, FFT module 73, CES module 74, TEQ module 76, and analog front-end 78. It should be noted that peripherals having additional functionality may be added as needed. DSP core 60 accesses each peripheral module through a standard memory read/write operation or through one of six programmable DMA channels. The DMA channels may be selectively programmed to access each of the plurality of peripheral modules in a different order as required by the configuration of ADSL transceiver 5 as the central office or as the remote terminal. HPI 68 allows an external user to issue commands to configure ADSL transceiver 5 as either the central office or the remote terminal. Once the user has configured ADSL transceiver 5 to function as either the central office or the remote terminal, DSP core 60 selects the appropriate firmware for executing the desired function from memory 64 via the program data bus (PDB).

The manner by which ADSL transceiver 5 is selected to be CO or RT may be set by the user through HPI 68, or may be auto-configured via a twisted pair signal. In order to reconfigure ADSL transceiver 5 to operate as either CO or RT, it is necessary to drive a control signal to each affected module. In the illustrated embodiment, each affected module has a configuration register which stores the control bit for that module. In other embodiments, however, the transceiver may have a global configuration register which provides the same control signal to each affected module, or other appropriate means such as a dedicated pin. As an example, FIG. 2 illustrates configuration register 71 of digital interface 70. Configuration register 71 stores the CONRT control bit, which when set to a binary 1, indicates that digital interface 70 is to operate in central office equipment, and when set to binary 0, indicates that digital interface 70 is to operate in remote terminal equipment.

Figure 3:
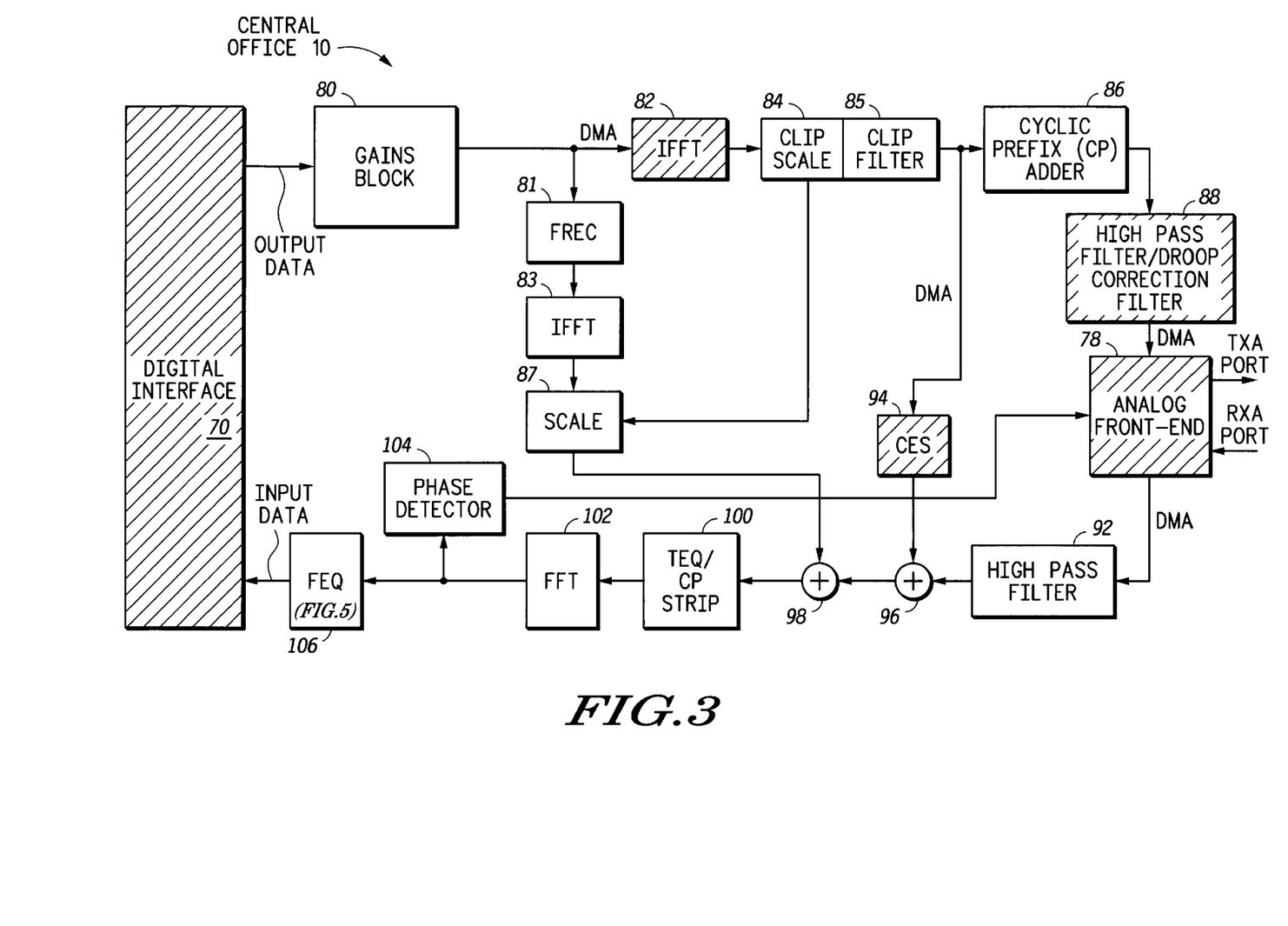
FIG. 3 illustrates, in partial block and partial logic diagram form, the ADSL transceiver of FIG. 2 configured to operate at a central office.

FIG. 3 illustrates, in block diagram form, a configuration of ADSL transceiver 5 when operating as a central office 10. When configured as central office 10, ADSL transceiver 5 comprises a digital interface 70, a gains block 80, an inverse fast Fourier transform (IFFT) 82, a clip scale 84, a clip filter 85, cyclic prefix (CP) adder 86, a high pass filter/droop correction filter 88, an analog front-end 78, a high pass filter 92, a circular echo synthesis (CES) module 94, an adder 96, an adder 98, a time domain equalizer (TEQ)/CP strip module 100, a fast Fourier transform (FFT) module 102, a phase detector 104, and a frequency domain equalizer (FEQ) 106. Central office 10 also comprises a FREC 81, an IFFT 83, and a scale 87.

Digital interface 70 has an output coupled to gains block 80 to provide a signal labeled "OUTPUT DATA". Gains block 80 has an output coupled to IFFT 82 and FREC 81. FREC 81 has an output coupled to IFFT 83. IFFT 83 has an output coupled to scale 87. Scale 87 has an output coupled to adder 98. IFFT 82 has an output coupled to clip scale 84 and clip filter 85. IFFT 82 is coupled to clip scale 84 to implement an IFFT scale factor. Clip scale 84 is coupled to scale 87. An output of clip filter 85 is coupled to cyclic prefix adder 86 and CES module 94. Cyclic prefix (CP) adder 86 has an output coupled to high pass filter/droop correction filter 88. High pass filter/droop correction filter 88 has an output coupled to analog front-end 78. Analog front-end 78 has an input for receiving a signal labelled "RXA PORT", an output for providing a signal labeled "TXA PORT", and an output coupled to high pass filter 92. High pass filter 92 has an output coupled to adder 96. CES module 94 has an output coupled to adder 96. Adder 96 has an output coupled to adder 98. Adder 98 has an output coupled to TEQ/CP strip module 100. TEQ/CP strip module 100 has an output coupled to FFT module 102. FFT module 102 has an output coupled to both FEQ 106 and phase detector 104. Phase detector 104 has an output coupled to analog front-end 78. FEQ 106 has an output coupled to digital interface 70 providing a signal labeled "INPUT DATA".

Assume the external user desires to configure ADSL transceiver 5 as central office 10. FIG. 3 illustrates ADSL transceiver 5 configured as central office 10. It should be noted that in FIG. 3 all shaded blocks are implemented as hardware and all unshaded blocks are implemented as firmware. As previously mentioned, the firmware is stored in memory 64. Digital interface 70 receives a plurality of serial digital data streams via the plurality of digital ports. Digital interface 70 provides those functions which are responsible for data transport. Digital data may be transported on any one of a plurality of programmable bearer channels. The plurality of programmable bearer channels are multiplexed together in a data buffer where they are synchronized into an appropriate one of the plurality of programmable bearer channels as determined by the ADSL standard. The framed data is then subjected to various operations. The data resulting from these operations is provided to a constellation output buffer (not shown in detail herein) as a plurality of complex numbers representing DMT tones. The complex numbers are subsequently transferred via the OUTPUT DATA signal.

The OUTPUT DATA signal is provided to gains block 80. Gains block 80 represents firmware which multiplies the data values transferred via the OUTPUT DATA signal by a calculated gain value which was previously computed as the product of three separate values. A first value used to generate the calculated gain value is a constellation normalizing constant which scales a plurality of constellations so that they all have a same average energy. A second value is a fine adjustment gain which is computed during initialization as part of a bit-loading algorithm. A third value is an equalizer gain which appropriately scales the carriers of ADSL transceiver 5 to undo the ripple in an analog pass band. The constellation normalizing constant and the equalizer gain are known before initialization begins, and their product is used at all times. The fine adjustment gain is included in the gain value once steady state transmission has begun and is changed only if a bit swapping operation takes place.

Gains block 80 provides adjusted data to IFFT 82 via a DMA channel of DSP core 60. IFFT 82 corresponds to FFT module 73 of FIG. 2, configured as an inverse fast Fourier transform. IFFT 82 subsequently converts the adjusted data values from the frequency domain to the time domain. Together, clip scale 84 and clip filter 85 provide the necessary limiting of input data values to prevent overflow in subsequent operations. It should be noted that an IFFT scale factor must be provided to clip scale 84 to calculate the clip scale value. Cyclic prefix adder 86 adds a cyclic prefix to a frame of data currently being operated upon. The cyclic prefix includes the last 32 samples of the frame which is copied and placed at the beginning of the same frame. The resulting frame is stored in memory 64 of ADSL transceiver 5.

From cyclic prefix (CP) adder 86, the resulting frame is provided to high pass filter/droop correction filter 88. Because ADSL transceiver 5 is functioning as central office 10, the high pass filter/droop correction filter 88 function is implemented by TEQ module 76 of FIG. 2, which receives data via the DMA and performs a high pass filter operation using a biquadratic (biquad) filter as well as droop correction using an FIR filter. TEQ module 76 will subsequently be described in greater detail in conjunction with FIG. 8 below.

High pass filter/droop correction filter 88 provides an output to analog front-end 78. This is accomplished via a third DMA channel of DSP core 60 which moves the results of the operations executed by TEQ module 76 to Analog front-end 78 which performs a filtering and a digital-to-analog conversion operation to provide an analog signal via the TXA PORT. It should be noted that when ADSL transceiver 5 is configured as central office 10, the ADSL standard requires that ADSL transceiver 5 transmit data to the remote terminal at a higher rate than the remote terminal transmits data back to central office 10. Furthermore, it should be noted that because data is transmitted at the higher rate, where necessary, functions to be executed in the transmit path of central office 10 are implemented as hardware (as indicated by the shaded boxes).

Analog front-end 78 receives the analog RXA PORT signal. This analog signal is converted by an analog-to-digital converter and the resulting digital signal is transferred via a fourth DMA channel to memory 64. From there, ADSL transceiver 5 implements the remaining functions of central office 10 in firmware residing in memory 64. First, a high pass filter operation is executed in high pass filter 92 using firmware. Next, adder 96 preconditions a resulting signal for the subsequent echo cancellation operation. Adder 98 then removes an echo from the preconditioned signal. Subsequently, TEQ/CP strip module 100 performs time domain equalization, which shortens the response of the channel, and removes the cyclic prefix. FFT module 102 then performs a translation of the signal provided by TEQ/CP strip module 100 from the time domain to the frequency domain. FEQ 106 subsequently performs frequency equalization on the resulting signal to generate the INPUT DATA signal. FEQ 106 is implemented to undo any magnitude and phase distortion the signal may have experienced in the channel. FEQ 106 will be discussed later in more detail. Digital interface 70 recovers digital data from the INPUT DATA signal which is further operated upon to provide data in a framed format. The framed data is subsequently demultiplexed and provided to each of the plurality of serial digital data outputs provided by the plurality of digital ports.

ADSL transceiver 5 also implements a scheme for echo cancellation. FREC 81 receives the adjusted data provided by gains block 80 and creates an estimate of the echo in the frequency domain. IFFT 83 subsequently converts the estimate from the frequency domain to the time domain. Scale 87 then scales the time domain estimate of the echo to match the scaling done in the transmit path. Scale 87 provides an estimated echo value. CES module 94 receives data from clip filter 85 via one of the DMA channels of DSP core 60. CES module 94 corresponds to CES module 74 of FIG. 2. CES module 94 removes the effect of interference in the echo signal. The cancellation value generated by CES module 94 is subsequently subtracted from a filtered receive signal provided by high pass filter 92. The estimated echo value provided by scale 87 is then subtracted using adder 98.

A signal generated by FFT module 102 is also provided to phase detector 104. Phase detector 104 derives timing information from a pilot tone of the receive signal. This information is then used to lock a sampling clock of the analog-to-digital and digital-to-analog converters in analog front-end 78.

Figure 4:
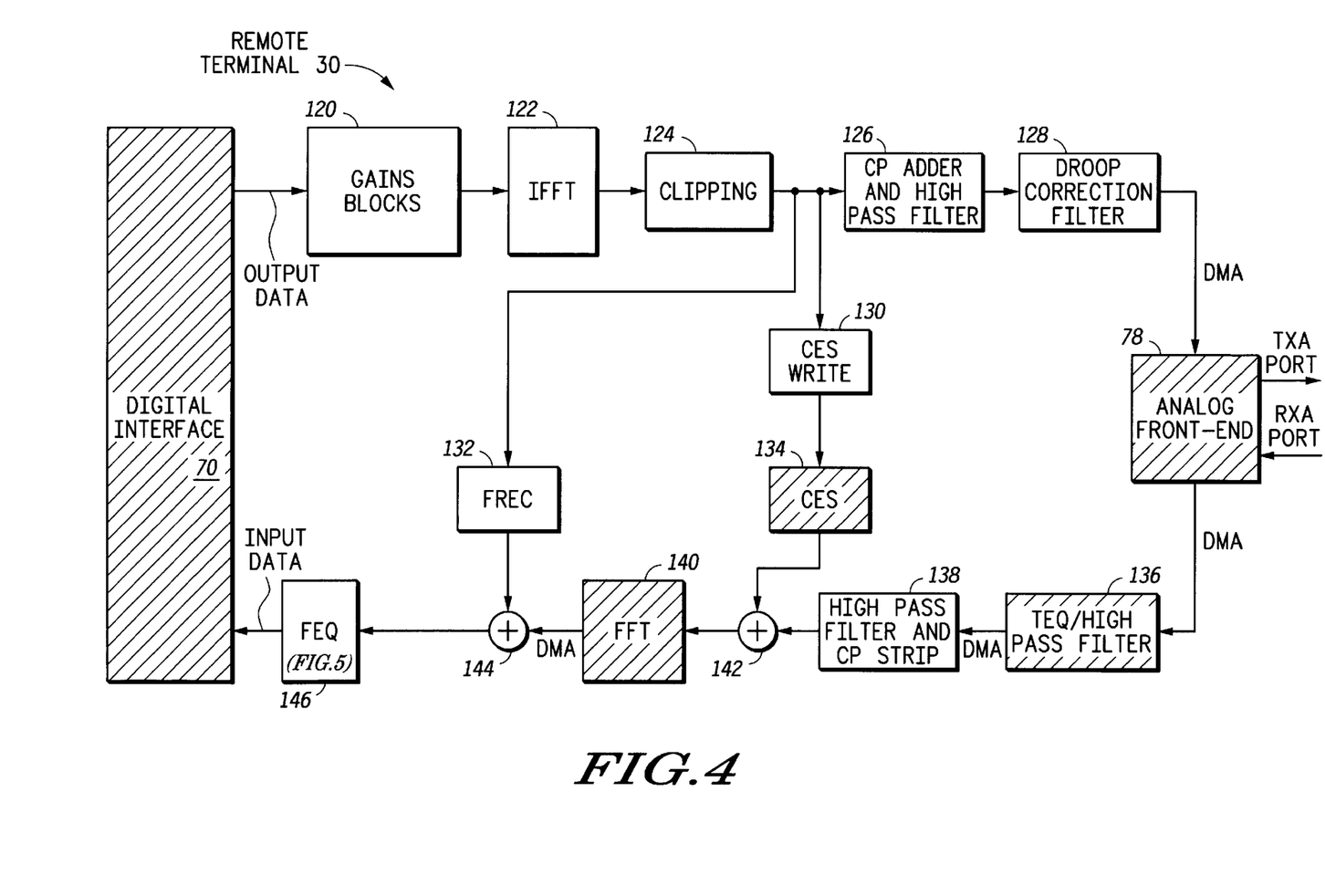
FIG. 4 illustrates, in partial block and partial logic diagram form, the ADSL transceiver of FIG. 2 configured to operate at a remote terminal.

FIG. 4 illustrates ADSL transceiver 5 configured to operate as a remote terminal 30. Remote terminal 30 comprises a digital interface 70, a gains block 120, an inverse fast Fourier transform (IFFT) module 122, a clipping block 124, a CP adder and high pass filter 126, a droop correction filter 128, a circular echo synthesis (CES) write 130, an FREC 132, a circular echo synthesis (CES) module 134, an analog front-end 78, a time domain equalization (TEQ)/high pass filter module 136, a high pass filter and CP strip 138, adder 142, a fast Fourier transform (FFT) module 140, adder 144, and frequency domain equalizer (FEQ) 146.

Digital interface 70 has an output coupled to gains block 120 to provide the OUTPUT DATA signal. Gains block 120 has an output coupled to IFFT module 122. IFFT module 122 has an output coupled to clipping block 124. Clipping block 124 has an output coupled to FREC 132, CES write 130, and cycle prefix (CP) adder and high pass filter 126. CP adder and high pass filter 126 has an output coupled to droop correction filter 128. Droop correction filter 128 has an output coupled to analog front-end 78. Analog front-end 78 has an input for receiving the RXA PORT signal, an output for providing the TXA PORT signal, and an output coupled to TEQ/high pass filter module 136. TEQ/high pass filter module 136 has an output coupled to high pass filter and CP strip 138. High pass filter and CP strip 138 has an output coupled to adder 142. CES write 130 has an output coupled to CES module 134. CES module 134 has an output coupled to adder 142. Adder 142 has an output coupled to FFT module 140. FFT module 140 has an output coupled to adder 144. FREC 132 has an output coupled to adder 144. Adder 144 has an output coupled FEQ 146. FEQ 146 has an output coupled to digital interface 70 to provide an INPUT DATA signal.

FIG. 4 illustrates ADSL transceiver 5 configured to operate as remote terminal 30. When operating as remote terminal 30, digital interface 70 provides those functions which are responsible for data transport. Digital data may be transported on any one of a plurality of programmable bearer channels. The data values communicated by the plurality of programmable bearer channels are multiplexed together in a data buffer, and then synchronized into data transmission frames which comply with the ADSL standard. The framed data is then subject to various operations. The data resulting from these operations is provided in a constellation output buffer as complex numbers representing DMT tones. The complex numbers are subsequently provided to gains block 120.

Gains block 120 implements a similar function to gains block 80 of FIG. 3. Specifically, gains block 120 adjusts the complex numbers provided by the OUTPUT DATA to generate a plurality of adjusted gain values. The adjusted gain values are provided to IFFT module 122. It should be noted that IFFT module 122 is implemented in firmware whereas IFFT 82 of FIG. 3 is implemented in hardware. IFFT module 122 is implemented in firmware because when ADSL transceiver 5 is operating as remote terminal 30, the data rate at which it is required to transmit information is slow enough to implement the transfer function in software. IFFT module 122 converts the adjusted gain values from the frequency domain to the time domain.

Subsequently, the converted values are provided to clipping block 124. Clipping block 124 limits the output value to prevent overflow in subsequent operations. The limited values are then provided to CP adder and high pass filter 126 and prepended with a cyclic prefix (CP), and, unlike high pass filter/droop correction filter 88 of FIG. 3, CP adder and high pass filter 126 is implemented in firmware. Again, CP adder and high pass filter 126 is implemented in firmware rather than hardware because the data transmission rate required by remote terminal 30 is slow enough to allow for the use of firmware. The filtered values provided by CP adder and high pass filter 126 are subsequently provided to droop correction filter 128. As with CP adder and high pass filter 126, droop correction filter 128 is implemented as firmware rather than hardware because a lower data transmission rate is used. Droop correction filter 128 subsequently provides the corrected, filtered values to analog front-end 78 via a first DMA channel of DSP core 60. Analog front-end 78 performs a filtering operation and a digital-to-analog conversion operation to provide an analog signal via the TXA PORT.

An analog signal is provided to analog front-end 78 via an RXA PORT. Analog front-end 78 subsequently performs an analog-to-digital conversion and provides a digital signal to TEQ/high pass filter module 136 via a second DMA channel of DSP core 60. TEQ/high pass filter module 136 corresponds to TEQ module 76 of FIG. 2. TEQ/high pass filter module 136 performs a time domain equalization function to shorten a channel response of the digital input signal. TEQ/high pass filter module 136 also performs a high pass filter function. It should be noted that TEQ/high pass filter module 136 and the high pass filter function implemented therein are implemented in hardware because they are in the receive path of remote terminal 30. As previously discussed, the receive path of remote terminal 30 is required to receive data at a highest data transmission rate.

An output of TEQ/high pass filter module 136 is provided to DSP core 60 via a third DMA channel of DSP core 60. DSP core 60 performs a second high pass filter function in high pass filter and CP strip 138 and stores a result in memory 64. The high pass filter is implemented in firmware and the output of the high pass filter is stripped of the cyclic prefix (CP) and provided to adder 142. A result of adder 142 is provided to FFT module 140. FFT module 140 performs a time domain to frequency domain conversion in hardware. It should be noted that FFT module 140 corresponds to FFT module 73 of FIG. 2. A result of the operation executed by FFT module 140 is provided to adder 144 via a fourth DMA channel of DSP core 60. An output of adder 144 is provided to FEQ 146 which corrects any magnitude and phase distortion the signal may have experienced in the channel. Note that FEQ 146 is the same as FEQ 106 of FIG. 3, and will be discussed later in connection with FIGS. 5 and 6. The output of FEQ 146 is then sent to digital interface 70. Digital interface 70 operates on the input data and provides it to a frame buffer. The data in the frame buffer is then demultiplexed into the plurality of digital data streams provided by the plurality of digital ports.

As with central office 10, remote terminal 30 implements an echo cancellation scheme. To implement this scheme, an output of clipping block 124 is converted to the frequency domain and FREC 132 generates an echo estimate in response thereto. Additionally, CES write 130 provides data transferred from memory 64 to CES module 134. It should be noted again that CES module 134 corresponds to CES module 74 of FIG. 2. In CES module 134, a cancellation signal is calculated for removing the effects of interference from the echo in the receive signal. The cancellation signal is subsequently subtracted from the received signal using adder 142. Additionally, the estimated echo value is subtracted from a filtered and demodulated value provided by FFT module 140 using adder 144.

Figure 5:
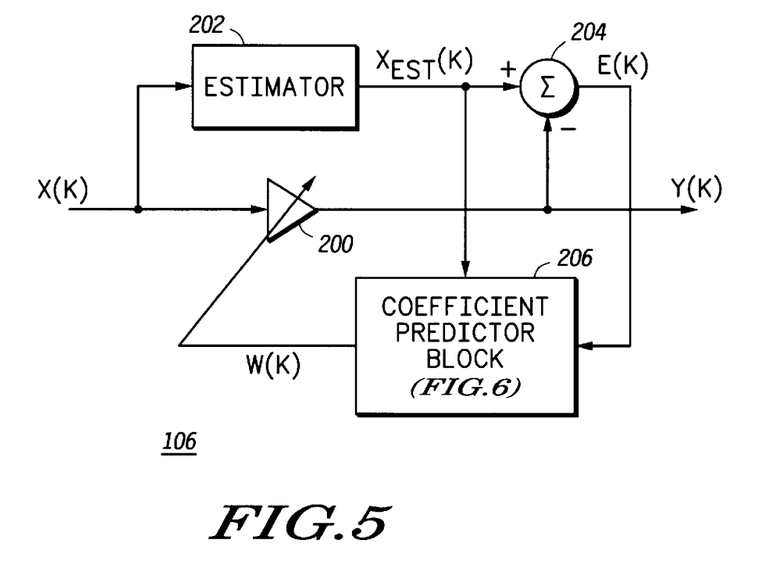
FIG. 5 illustrates, in block diagram form, the frequency domain equalizer (FEQ) suitable for use in the signal processors of FIGS. 3 and 4 according to the present invention.

FIG. 5 illustrates, in block diagram form, FEQ 106, suitable for use in the signal processors of FIGS. 3 and 4 according to the present invention. FEQ 106 includes complex multiplier 200, signal estimator 202, an error estimator in the form of summing device 204, and coefficient predictor block 206. Complex multiplier 200 has a first input for receiving a complex signal labeled "X(k)", a second input, and an output for providing a corrected signal labeled "Y(k)". Signal estimator 202 has an input for receiving complex signal X(k), and an output for providing an estimated signal labeled "$X_{EST}(k)$". Summing device 204 has a first input for receiving estimated signal $X_{EST}(k)$, a second input for receiving corrected signal Y(k), and an output for providing an error signal labeled "E(k)". Coefficient predictor block 206 has a first input for receiving error signal E(k), a second input for receiving estimated signal $X_{EST}(k)$, and an output for providing a new coefficient labeled "W(k)" to the second input of complex multiplier 200.

In operation, FEQ 106 is a one-tap equalizer and receives the complex signal X(k) from FFT 102 (FIG. 3). Note that the equalizer shown in FIG. 5 operates on one carrier channel provided by FFT 102, and since FEQ 106 operates on 32 carriers, it includes a total of 32 one-tap equalizers constructed the same as that shown in FIG. 5. Likewise, FEQ 146 operates on 256 carriers and includes 256 one-tap equalizers each constructed the same as the one shown in FIG. 5. Each of the one-tap equalizers is coupled to receive one of the 256 outputs of FFT 102. FEQ 106 performs the calculations for providing a new coefficient according the equation:

$$W(k)=W(k-1)+4\mu E(k)re[X^*_{EST}(k)] \quad (2)$$

where

W(k)=equalizer coefficient at time k;

$4\mu$=adaptation constant;

E(k)=calculated error term;

$X^*_{EST}(k)$=conjugate of received data estimate;

$re[X^*_{EST}(k)]$=the real part of the conjugate of received data estimate; and $im[X^*_{EST}(k)]$=the imaginary part of the conjugate of received data estimate.

To derive equation (2), note that complex signal X(k) is equal to $X_{EST}(k)+E(k)$ where $E(k)=X_{EST}(k)Ae^{j\theta}$ and A is gain and $\theta$ is the phase of the channel distortion. (See FIG. 1.)

Expanding X(k), $$X(k)=X_{EST}(k)+X_{EST}(k)Ae^{j\theta}=re[X_{EST}$$
$$(k)]+j(im[X_{EST}(k)]+re[X_{EST}(k)]A\cos\theta-im[X_{EST}(k)]A\sin\theta$$
$$+j(im[X_{EST}(k)]A\cos\theta)+j(re[X_{EST}(k)]A\sin\theta)=$$
$$(1+A\cos\theta)re[X_{EST}(k)]-(A\sin\theta)im[X_{EST}(k)]+$$
$$j((1+A\cos\theta)im[X_{EST}(k)]+(A\sin\theta)re[X_{EST}(k)]) \quad (3)$$

and $$E(k)=X(k)-X_{EST}(k)=(1+A\cos\theta)re[X_{EST}(k)]-(A\sin\theta)im[X_{EST}(k)]-re[X_{EST}(k)]+j((1+A\cos\theta)im[X_{EST}(k)]+(A\sin\theta)re[X_{EST}(k)]-im[X_{EST}(k)]) \quad (4)$$

implying:

$$re[E(k)]=(A\cos\theta)re[X_{EST}(k)]-(A\sin\theta)im[X_{EST}(k)] \quad (5)$$

and $$im[E(k)]=(A\cos\theta)im[X_{EST}(k)]+(A\sin\theta)re[X_{EST}(k)] \quad (6)$$

Expanding equation (1):

$$E(k)X_{EST}^*(k)=re[E(k)]re[X_{EST}(k)]+im[E(k)]im[X_{EST}(k)]+j(im[E(k)]re[X_{EST}(k)])-j(re[E(k)]im[X_{EST}(k)]) \quad (7)$$

$$=((A\cos\theta)re[X_{EST}(k)]-(A\sin\theta)im[X_{EST}(k)])re[X_{EST}(k)]+((A\cos\theta)im[X_{EST}(k)]+(A\sin\theta)re[X_{EST}(k)])im[X_{EST}(k)]$$
$$+j((A\cos\theta)im[X_{EST}(k)]+(A\sin\theta)re[X_{EST}(k)])re[X_{EST}(k)])-j((A\cos\theta)re[X_{EST}(k)]-(A\sin\theta)im[X_{EST}(k)])im[X_{EST}(k)]) \quad (8)$$

Taking E [ ] of $E(k)X^*_{EST}(k)$, where E[ ] is the expected value, and since $re[X_{EST}(k)]$ and $im[X_{EST}(k)]$ are uncorrelated random variables with zero mean:

$$E[E(k)X^*_{EST}(k)]=A\cos\theta+A\cos\theta+j(A\sin\theta)+j(A\sin\theta) \quad (9)$$

$$re[E[E(k)X^*_{EST}(k)]]=2(E[re[E(k)]re[X_{EST}(k)]])=2(E[im[E(k)]im[X_{EST}(k)]]); \quad (10)$$

and $$im[E[E(k)X^*_{EST}(k)]]=2(E[im[E(k)]re[X_{EST}(k)]])=-2(E[re[E(k)]im[X_{EST}(k)]]).$$

where the computations have been reduced to two multiplies and one addition (or one subtraction). Employing this method for LMS and preserving the original $\mu$, equation (1) can be re-written as:

$$W(k)=W(k-1)+2\mu(re[E(k)X^*_{EST}(k)]+j(im[E(k)X^*_{EST}(k)])) \quad (11)$$

By direct substitution, $$W(k)=W(k-1)+4\mu(re[E(k)]re[X_{EST}(k)]+j(im[E(k)]re[X_{EST}(k)])) \quad (12)$$

or $$W(k)=W(k-1)+4\mu(re[E(k)]re[X_{EST}(k)]-j(re[E(k)]im[X_{EST}(k)])) \quad (13)$$

or $$W(k)=W(k-1)+4\mu(im[E(k)]im[X_{EST}(k)]-j(re[E(k)]im[X_{EST}(k)])) \quad (14)$$

or $$W(k)=W(k-1)+4\mu(im[E(k)]im[X_{EST}(k)]+j(im[E(k)]re[X_{EST}(k)])) \quad (15)$$

Note that equation (12) is an expanded version of equation (2) and equations (13–15) are alternate coefficient update equations that provide substantially similar results.

Figure 6:
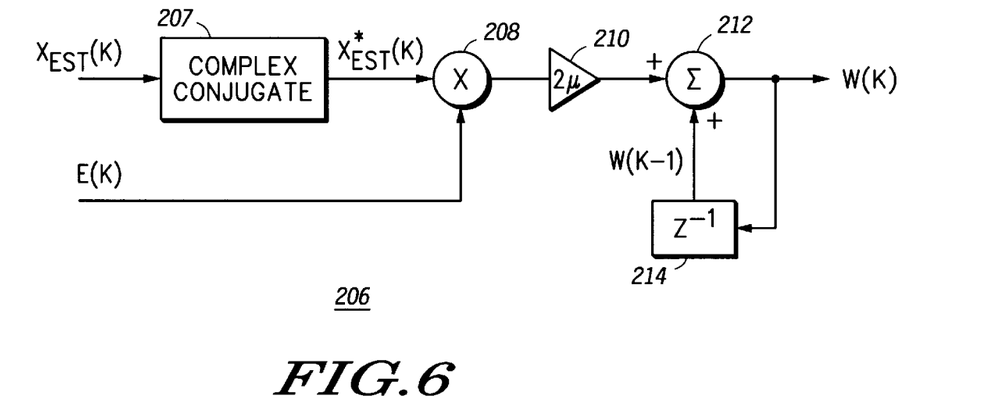
FIG. 6 illustrates, in block diagram form, the coefficient predictor block of the FEQ of FIG. 5.

The output of multiplier 208 has a real component equal to either one of a product of a real component of the complex conjugate of the estimated signal and a real component of the error signal, or a product of an imaginary component of the complex conjugate of the estimated signal and an imaginary component of the error signal. The output of multiplier 208 has an imaginary component equal to either a product of a real component of the complex conjugate of the estimated signal and an imaginary component of the error signal, or a product of an imaginary component of the complex conjugate of said estimated signal and a real component of the error signal.

Referring back to FIG. 5, complex signal X(k) is received by complex multiplier 200 and multiplied by a new coefficient W(k) to obtain corrected signal Y(k). Signal estimator 202 also receives X(k) and provides an estimated signal $X_{EST}(k)$. Summing device 204 receives the estimated signal $X_{EST}(k)$ and the corrected signal Y(k) and provides an error signal. Note that estimated signal $X_{EST}(k)$ may also be provided by using Y(k) as an input to signal estimator 202. The error signal is used by the coefficient predictor block to the generate a new coefficient W(k). Coefficient predictor block 206 is illustrated in FIG. 6 and described below in more detail.

FIG. 6 illustrates, in block diagram form, coefficient predictor block 206 of the FEQ of FIG. 5. Coefficient predictor block 206 includes complex conjugate 207, multiplier 208, multiplier 210, summing device 212, and delay element 214. Complex conjugate 207 has an input for receiving the estimated signal $X_{EST}(k)$, and an output terminal for providing conjugate estimated signal $X^*_{EST}(k)$. Multiplier 208 has a first input for receiving conjugate estimated signal $X^*_{EST}(k)$, a second input for receiving error signal E(k), and an output. Multiplier 210 has an input coupled to the output of multiplier 208, and an output. Multiplier 210 is for multiplying the conjugate estimated signal $X^*_{EST}(k)$ by a predetermined scalar. Summing device 212 has a first input coupled to the output of multiplier 210, a second input for receiving prior coefficient W(k−1), and an output for providing new coefficient W(k). Delay element 214 has an input for receiving coefficient W(k), and an output for providing a delayed coefficient W(k−1).

In operation, coefficient predictor block 206 is used to calculate the coefficients as defined by equation (2) above. The coefficients are then used by equalizer 106 (or 146) in generating the corrected signal Y(k).

The implementation of the invention described herein is provided by way of example only. However, many other implementations may exist for executing the functions described herein. While the present invention has been illustrated and described with reference to specific embodiments, further modifications and improvements will occur to those skilled in the art. For example, different portions of the signal processing function may be implemented by hardware, firmware, or a combination of hardware and firmware. It is to be understood, therefore, that this invention is not limited to the particular forms illustrated herein and that the appended claims cover all modifications that do not depart from the scope of this invention.

We claim:

1. An equalizer for removing errors in a complex signal which is subject to symmetric phase and amplitude distortion, comprising:

a first complex multiplier having a first input for receiving the complex signal, a second input for receiving a complex coefficient, and an output for providing a corrected signal;

a signal estimator having an input for receiving the complex signal, and an output for providing an estimated signal;

an error estimator having an input for receiving said corrected signal, and an output for providing an error signal;

a coefficient predictor comprising:

a second multiplier having a first input for receiving a complex conjugate of said estimated signal, a second input for receiving said error signal, and an output;

said output of said second multiplier having a real component equal to a selected one of:

(a) a product of a real component of said complex conjugate of said estimated signal and a real component of said error signal, or             (b) a product of an imaginary component of said complex conjugate of said estimated signal and an imaginary component of said error signal;

said output of said second multiplier having an imaginary component equal to a selected one of:

(c) a product of a real component of said complex conjugate of said estimated signal and an imaginary component of said error signal, or             (d) a product of an imaginary component of said complex conjugate of said estimated signal and a real component of said error signal;

a third scalar multiplier having an input coupled to said output of said second multiplier, and an output, said third scalar multiplier multiplying said input thereof by a predetermined scalar to provide said output thereof; and         a summing device having a first input coupled to said output of said third scalar multiplier, a second input for receiving a prior coefficient, and an output for providing a new coefficient as a sum thereof.

2. The equalizer of claim 1 wherein said error estimator comprises a second summing device having a first input coupled to said output of said signal estimator, a second input coupled to said output of said first complex multiplier, and an output for providing said error signal.

3. The equalizer of claim 1 further comprising a complex conjugate having an input for receiving said estimated signal, and an output for providing said complex conjugate of said estimated signal.

4. The equalizer of claim 1 further comprising a delay element having an input coupled to said output of said summing device, and an output coupled to said second input of said summing device.

5. In a signal processor having an input for receiving a complex signal which is subject to symmetric phase and amplitude distortion, which multiplies the complex signal by a complex coefficient to provide a corrected signal as an output thereof, a method for updating a prior complex coefficient to form a current complex coefficient, comprising the steps of:

estimating a signal portion of the complex signal to provide an estimated signal;

estimating an error portion of the complex signal to provide an error signal;

forming a complex conjugate of the estimated signal;

providing a real component of an intermediate signal by forming a selected one of:

(a) a product of a real component of said complex conjugate of said estimated signal and a real component of said error signal, or         (b) a product of an imaginary component of said complex conjugate of said estimated signal and an imaginary component of said error signal;

providing an imaginary component of said intermediate signal by forming a selected one of:

(c) a product of a real component of said complex conjugate of said estimated signal and an imaginary component of said error signal, or         (d) a product of an imaginary component of said complex conjugate of said estimated signal and a real component of said error signal;

scaling said intermediate signal by a predetermined scalar to provide a scaled product; and     adding the prior complex coefficient to said scaled product to obtain the current complex coefficient.

6. The method of claim 5 wherein said step of scaling comprises the step of scaling said product by a predetermined scalar equal to twice an adaptation constant to provide the scaled product.

7. In an asymmetric digital subscriber line (ADSL) system which substantially conforms to American National Standards Institute (ANSI) standard T1E1.4/94-007R7, an equalizer for removing errors in a complex received signal which is subject to symmetric phase and amplitude distortion, comprising:

a first complex multiplier having a first input for receiving the complex received signal, a second input for receiving a complex coefficient, and an output for providing a corrected signal;

a signal estimator having an input for receiving the complex received signal, and an output for providing an estimated signal;

an error estimator having an input for receiving said corrected signal, and an output for providing an error signal;

a coefficient predictor comprising:

a second multiplier having a first input for receiving a complex conjugate of said estimated signal, a second input for receiving said error signal, and an output;

said output of said second multiplier having a real component equal to a selected one of:

(a) a product of a real component of said complex conjugate of said estimated signal and a real component of said error signal, or             (b) a product of an imaginary component of said complex conjugate of said estimated signal and an imaginary component of said error signal said output of said second multiplier having an imaginary component equal to a selected one of:
- (c) a product of a real component of said complex conjugate of said estimated signal and an imaginary component of said error signal, or
- (d) a product of an imaginary component of said complex conjugate of said estimated signal and a real component of said error signal;

third scalar multiplier having an input coupled to said output of said second multiplier, and an output, said scalar multiplier multiplying said input thereof by a predetermined scalar to provide said output thereof; and a summing device having a first input coupled to said output of said third scalar multiplier, a second input for receiving a prior coefficient, and an output for providing a new coefficient as a sum thereof.

8. The equalizer of claim 7 wherein said error estimator comprises a second summing device having a first input coupled to said output of said signal estimator, a second input coupled to said output of said first complex multiplier, and an output for providing an error signal.

9. The equalizer of claim 7 further comprising a complex conjugate having an input for receiving said estimated signal, and an output for providing said complex conjugate.

10. The equalizer of claim 7 further comprising a delay element having an input coupled to said output of said summing device, and an output coupled to said second input of said summing device.

11. The equalizer of claim 7 wherein the ADSL system further comprises:

a time-to-frequency converter having an input for receiving a time domain received signal, and an output for providing a plurality of complex received signals; and a frequency domain equalizer (FEQ) comprising the equalizer and a plurality of additional equalizers each constructed substantially as the equalizer is constructed.

12. The equalizer of claim 11 wherein said plurality of additional equalizers comprises 255 additional equalizers.

* * * * *